United States Patent [19]
Dowling

[11] Patent Number: 6,128,583
[45] Date of Patent: Oct. 3, 2000

[54] MOTOR STATOR CONDITION ANALYZER

[75] Inventor: Martin Joseph Dowling, Norristown, Pa.

[73] Assignee: Crane Nuclear, Inc., Kennesaw, Ga.

[21] Appl. No.: 09/019,259

[22] Filed: Feb. 5, 1998

Related U.S. Application Data

[63] Continuation-in-part of application No. 08/650,228, May 20, 1996.

[51] Int. Cl.$^7$ .............................. G01R 21/00; G01R 27/00
[52] U.S. Cl. ............................ 702/58; 702/183; 702/185; 324/772
[58] Field of Search .................................. 702/57, 58, 59, 702/60, 62, 64, 65, 69, 72, 115, 182, 183, 184, 185, 198, FOR 103, 104, 106, 111, 170; 318/565, 690; 388/916; 324/772; 340/648; 361/30

[56] References Cited

U.S. PATENT DOCUMENTS

| | | | |
|---|---|---|---|
| 5,270,640 | 12/1993 | Kohler et al. | 324/772 |
| 5,514,978 | 5/1996 | Koegl et al. | 324/772 |

OTHER PUBLICATIONS

"Conference Record of the 1989 IEEE Industry Applications Society Annual Meeting Part II", Papers Presented at the 1989 Industry Applications Conference Twenty–Fourth IAS Annual Meeting, Oct. 1–5, 1989.

"Current Practices and Trends in Mechanical Failure Prevention", Proceedings of the 44th Meeting of the Mechanical Failures Prevention Group, Apr. 3–5, 1990, Complied by Henry C. Pusey and Sallie C. Pusey, a publication of the Vibration Institute.

*Primary Examiner*—Marc S. Hoff
*Assistant Examiner*—Manuel L Barbee
*Attorney, Agent, or Firm*—Womble Carlyle Sandridge & Rice

[57] ABSTRACT

A motor performance analyzer senses currents and voltages applied to the motor, converts the sensed signals to digital data signals, and stores the digital data signals. The analyzer includes a processor for evaluating the digital data and a display for alerting a user or technician to potential winding faults. Advanced signal processing techniques are used to further evaluate stored data and to provide trending information.

5 Claims, 4 Drawing Sheets

MOTOR STATOR CONDITION ANALYZER

CROSS-REFERENCE TO RELATED APPLICATIONS

This is a continuation-in-part of U.S. patent application Ser. No. 08/650,228, filed May 20, 1996 and entitled "Motor Condition And Performance Analyzer".

BACKGROUND OF THE INVENTION

The present invention generally pertains to a device and method for evaluating and reporting motor condition and more particularly, to an improved method and apparatus for assessing stator condition while the motor is operating.

Motors, particularly electrical motors, play a key role in industry. Such motors are used to drive fans, pumps, compressors, valves, and many other machines. It is potentially very costly to allow a significant problem to go on unnoticed in either the motor or the motor driven machine. It is also costly and very time consuming to attempt to repair a nonexistent problem. With present methods of analyzing motor performance, these costly situations often occur. Thus there is a need for an improved diagnostic method and apparatus for use with motors and motor driven machines.

Most prior art motor monitors for detecting winding faults require the use of coils intrusively placed within the motor, or alternately, monitoring the neutral return line for radio frequency evidence of arcing. These monitors require extra hardware beyond the normally used three current and three voltage probes. Additionally, in most motors the neutral wire is unavailable. Accordingly, to implement comprehensive detection, all three electrical leads have to be monitored with high frequency probes in addition to the usual power frequency probes. This involves multiple additional sensors and channels, high frequency sensors, and extra signal conditioning.

A more recent innovation (U.S. Pat. No. 5,270,640, Kohler et al, Dec. 1993) calculates the effective negative sequence resistance ($R_2$) and reactance ($X_2$) from the negative sequence voltage and current vectors, and tracks these parameters for indications of winding degradation. The present invention also uses the negative sequence resistance and reactance to monitor deterioration in motors, but calculates these parameters directly from the normal, as opposed to sequence, voltage and current vectors thus avoiding two coordinate transformations. The present invention further provides a means for calibrating the current probes, and adjusting the algorithm used for calculating the negative sequence parameters in the event the normal multi-phase sequence (e.g., ABC) is reversed (CBA). Further, the present invention provides a means for establishing thresholds for determining when the motor winding becomes non-normal.

A memory is included for storing motor data (e.g., in a database), which allows for comparisons to be made between the motor's present condition and performance, historical data for the same motor to determine the presence of trends, and data on similar "sister" motors to ascertain normality with respect to a population of similar motors. The database accumulates knowledge about the motor, which may be sorted by motor load. The information provided by the present invention is useful for changing motor operating load, scheduling maintenance on the motor, planning for replacement of the motor, or even shutting the motor down, as is appropriate. Furthermore, the system compares multiple types of motors under similar operating conditions so that comparisons can be made, which are useful, for instance, in making purchasing decisions.

The present invention can be used to provide either on-line continuous monitoring of motor condition, or as a periodic inspection tool. The present invention also provides detailed analysis capability for intensive diagnostic work and a database for determining trends and relative performance (compared to similar motors). The present invention avoids the intrusive measurement problems associated with most prior art, and avoids the complex intermediate vector calculations required in the more recent prior art, U.S. Pat. No. 5,270,640. In addition, the present invention corrects for phase sequence reversal, offers diagnostics based on "sister" motor data as well as historical data, and categorizes the data by load to provide for an optimum baseline.

BRIEF SUMMARY OF THE INVENTION

Briefly stated, the present invention comprises a method of evaluating stator condition of a polyphase induction motor, the motor including a number of pole pairs, by using an electrical signature of the motor The method comprises the steps of: simultaneously sensing an instantaneous current signal supplied to the motor as a function of time for three electrical phases of the motor; simultaneously sensing an instantaneous voltage supplied to the motor as a function of time for three electrical phases of the motor; calculating an effective negative sequence reactance and a negative sequence resistance directly from the measured voltages and currents for each phase of the motor, without calculating any intermediate negative sequence voltage or current vectoral values (magnitude and phase angle or real and imaginary); and comparing the effective negative resistance and the effective negative sequence reactance values to predetermined values whereby a predetermined difference between either the effective negative resistance valves and the effective negative sequence reactance valves and the respective predetermined valve is indicative of a stator winding fault.

BRIEF DESCRIPTION OF THE SEVERAL VIEWS OF THE DRAWINGS

The foregoing summary, as well as the following detailed description of preferred embodiments of the invention, will be better understood when read in conjunction with the appended drawings. For the purpose of illustrating the invention, there are shown in the drawings embodiments which are presently preferred. It should be understood, however, that the invention is not limited to the precise arrangements and instrumentalities shown. In the drawings.

DETAILED DESCRIPTION OF THE INVENTION

The present invention is directed to an apparatus and method of evaluating the stator condition of induction motors, particularly three-phase induction motors, through the use of a motor monitor. The motor monitor can be linked to a processor executing analysis and database software for storing motor data and analyzing and reporting on the condition of the motor. The motor monitor can be connected to the processor through a variety of means, including both hard-wired means and non-hardwired means, such as by infrared or other wireless transmission.

Figure 1:
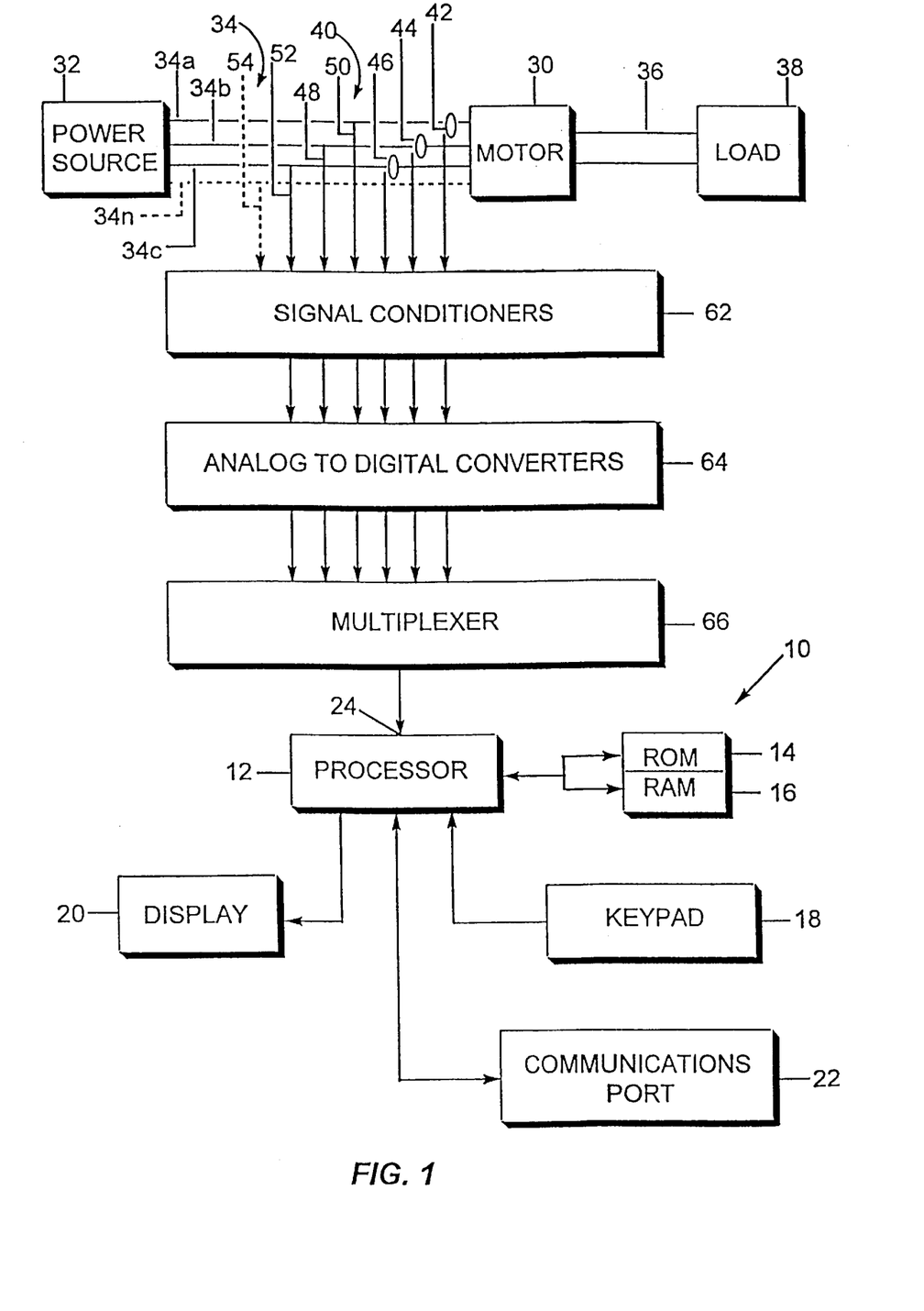
FIG. 1 is a functional schematic block diagram of a preferred embodiment of a system for analysis of a three phase motor in accordance with the present invention.

Referring to the drawings, wherein the same reference numerals indicate like elements throughout the several figures, there is shown in FIG. 1 a functional schematic block diagram of a preferred embodiment of a processor-based motor monitor system 10 which operates in accordance with the methods of the present invention. In the presently preferred embodiment, the system 10 includes a processor 12 which preferably is a commercial microprocessor, such as an Intel x86 type processor or similar processor, although other processors may also be used with the present invention, such as a digital signal processor, as are known to those of ordinary skill in the art of data collection devices. Preferably the processor 12 includes or has access to a memory, which preferably includes a read only memory (ROM) 14 employed for storing fixed information, such as executable processor code and/or fixed data parameters or parameter ranges, and a random access memory (RAM) 16 of a predetermined size which is adapted for temporary storage of data accumulated for analysis. The ROM 14 is of a type well known to those of skill in the art for storing fixed information or information which is not changed by the processor 12 during execution of processor operations. However, the ROM 14 may be of the type which can be reprogrammed (e.g., a PROM, EPROM, EEPROM, etc.) or otherwise changed periodically to update, modify or change how the processor 12 operates. The RAM 16 may also be used for temporarily storing portions of the executable code or input information. As will also be known to those of ordinary skill in the art, other memory devices could also be connected to the processor 12, such as a magnetic or optical storage device, or a PCMCIA compatible storage device (not shown) for storing collected and/or processed data and related information, such as a time stamp.

A keypad 18 is presently employed as the primary user input device to permit a user to communicate with the processor 12. The keypad 18 includes a plurality of buttons or switches for inputting information or commands. In the presently preferred embodiment, the keypad 18 includes buttons for instructing the system 10 to display previously recorded or stored data, including power data and motor condition flag histories for designated time periods, power quality data, such as per phase voltage and current data, and power data, such as input power. The keypad 18 also preferably includes one or more buttons related to motor identification information. Although a keypad 18 is presently preferred, it will be appreciated by those skilled in the art that any other type of input device may be employed instead of or in addition to the keypad 18, such as a keyboard, mouse or track ball type device which allows a user to scroll through predetermined command screens, as is known in the art.

A display 20 is connected to the processor 12 for displaying output from the processor 12. The display 20 provides information to a user, such as the per phase voltage and current data, power data and motor identification information, as well as event flag information for alerting the user of a potential problem with the motor system, such as a problem with the motor stator, current, voltage, or loading. In the presently preferred embodiment, the display 20 comprises a one line LCD display in combination with an array of LEDs. The LCD display displays motor data, as previously discussed, such as per phase current and voltage data and power information and the LEDs display event flags for alerting the user to potential motor problems. Of course, other types of suitable output devices may be employed in addition to or instead of the display 20, such as a CRT, a VDT, or a printer. In addition to the display 20, a remote display (not shown) may be included which is located at a motor control center (MCC) so that an operator or technician is not required to leave the MCC to check on the condition of a motor. Alternatively, the display 20 could be located remotely from the motor, such as at the MCC.

The processor 12 further includes at least one communications port 22 which may be either a parallel port, a serial port, or both. The communications port 22 is employed for receiving data from another location or device, for transmitting data to another device or for sending data to another location utilizing a modem or other such transmission device (not shown) in a manner well known in the computer art. In the presently preferred embodiment, the communications port 22 is used to download stored information, such as information stored in the RAM 16 to another data storage device or a computer, such as a personal computer system well known to those skilled in the art. Ultimately, in the presently preferred embodiment, information stored in the memory (e.g., the RAM 16) is transmitted to a computer (not shown) operating according to the methods of the present invention, which analyzes and processes the information. In addition, the processor 12 also includes an input port 24 for receiving sensor data, as described in more detail below.

In the presently preferred embodiment, the processor based system 10 comprises a relatively small and unobtrusive device for collecting and storing motor data, which data is then downloaded, transmitted, or otherwise transferred to a computer (not shown), for processing. However, it will be apparent to those of ordinary skill in the art that the system 10, as opposed to being a relatively small and unobtrusive data collection and storage device, could also comprise a more sophisticated device, such as a personal or laptop computer. Also, variations in the input/output components of the system 10 may be made depending upon particular applications. For example, in some applications, both a printer and a video display 20 may be desired. In other applications, a keyboard, as opposed to the small keypad 18 may be desired. It should, therefore, be clearly understood by those skilled in the art that the present invention is not limited to the particular hardware configuration shown in FIG. 1 but may be implemented using any type of hardware configuration suitable for a particular application. The processor based system 10 may comprise a personal computer, or any other suitable type of computer, such as a lap-top computer, mini-computer, main frame computer or the like.

The above-described system 10 is employed for on-line analysis of the stator condition of a polyphase motor driving a load, the polyphase motor being illustrated schematically as a three-phase motor 30. In the presently preferred embodiment, the present invention is directed particularly to analyzing the condition of a three phase induction motor 30 using only three phases of current and voltage. The motor 30 is connected to a suitable power source 32 utilizing a suitable three-phase cable 34 having individual conductors or supply lines, including an a-phase conductor 34a, a b-phase conductor 34b, a c-phase conductor 34c, and if appropriate, a neutral conductor 34n.

The output of the motor 30 is connected through a suitable output shaft or other type of mechanical transmission means 36 to a load 38 which may be a fan, pump, compressor, valve or virtually any other type of machinery or equipment.

Depending upon the application, the transmission means or transmission 36 may include suitable clutches, gearing, belts or other mechanical interconnecting devices (not shown) of a type well known in the art. For the sake of brevity, the combination of the motor 30, transmission 36, and the load 38 will herein sometimes be collectively referred to as the motor system. It should be appreciated by those skilled in the art that the present motor monitor system 10 may be employed for analysis of polyphase induction motors which may be connected to any suitable type of power source 32 for driving any type of load 38 (even no-load) utilizing any type of transmission means 36, and that the embodiment of the motor system shown in FIG. 1 is only for the purpose of illustrating a preferred embodiment of the structure and operation of the present invention.

The motor monitor system 10 further includes a plurality of individual sensors or probes shown collectively as 40, for monitoring predetermined electrical and mechanical variables of the motor 30 and transmission means 36, and for converting the monitored characteristics into electrical signals for processing by the processor 12. In the present embodiment, the sensors 40 include three clamp-on current probes 42, 44, 46, one of the current probes being clamped to each of the conductors 34a, 34b, 34c, of the three phase cable 34 interconnecting the motor 30 with the power source 32. The clamp-on current probes 42, 44, 46 are generally of a type well known in the electrical measurement art and are commercially available from a variety of well known sources. The current probes 42, 44, 46 can be inductive or Hall effect or any other type which converts current in a conductor into a related voltage signal. The currents may also be transduced by current shunts or by current transformers instead of the clamp-on type of sensors. Additional, optional current sensors (not shown) for detecting ground leaks may be provided for surrounding two or more phase leads. The probes 42, 44, 46 may be applied to the motor circuit directly or to any control circuit which follows the phase currents proportionally. When current transformers (not shown) are used, the present invention corrects or compensates for any amplitude and phase shifts caused by the transformers, as described in more detail below. Since current probes are known to those of ordinary skill in the art, complete details of the structure and operation of the current probes 42, 44, 46 are not necessary for a complete understanding of the present invention.

The sensors 40 further include voltage probes 48, 50, 52, each of which is connected to one of the conductors 34a, 34b, 34c of the three phase cable 34 and, if a neutral conductor 34n, shown in phantom, is present, a fourth voltage probe 54 is connected to the neutral conductor 34n of the cable 34. The voltage probes 48, 50, 52, 54 are generally of a type well known in the art and are commercially available from a variety of sources. For larger power systems with higher voltages, direct connection of the voltage probes 48, 50, 52 to the individual phase conductors 34a, 34b, 34c is generally impractical, and thus, potential transformers (not shown) may be used which reduce the voltage at the measurement point. The probes 48, 50, 52 are still used, but are connected to the output of the respective potential transformer instead of directly to each of the individual phase conductors 34a, 34b, 34c. As discussed in more detail below, if the voltage probes 48, 50, 52 are connected to a transformer, then compensation is made, in the present invention via software, for any reduction in voltage and any phase shifts caused by the transformer (for instance, as is known in the art, wye-delta and delta-wye transformers introduce a 30° phase shift). Since voltage probes are generally commercially available and known to those of skill in the art, further details of the structure and operation of the voltage probes 48, 50, 52, 54 are not necessary for a complete understanding of the present invention.

The motor monitor system 10 further includes a plurality of signal conditioners 62 which are illustrated collectively in FIG. 1. Preferably, a separate signal conditioner is provided for each of the sensors 40, with the respective output of the sensor 40 being connected directly to the input of the respective signal conditioner 62. Each of the signal conditioners 62 functions in a manner well known in the art to amplify, impedance match, filter and otherwise standardize and improve or enhance the electrical output signals received from the sensors 40. Standardization of signals includes conversion of currents to a proportional voltage, amplitude scaling and appropriate filtering to limit bandwidth. The precise structure and operation of each signal conditioner depends upon the particular type of sensor 40 with which the signal conditioner 62 is employed. Preferably, each of the signal conditioners 62 also includes an anti-alias low pass filter which functions to improve the integrity of the acquired sensor data by filtering out, prior to digitizing, sensor signal frequencies greater than approximately half of the sampling rate of the digitizer.

The system 10 further includes a plurality of individual analog-to-digital (A/D) converters 64 shown collectively in FIG. 1. The A/D converters 64 function in a manner well known in the art to receive the conditioned and filtered analog output signals from the corresponding signal conditioner 62 and convert the received analog signals at a predetermined sampling rate into digital signals (i.e., a stream or array of digital data) for data manipulation and analysis by the processor 12. A typical sampling rate could be 1,000 samples per second for each signal. Thus, each of the A/D converters 64 produces an output data array or bit stream corresponding to the particular sensor 40 with which the analog-to-digital converter is associated.

The outputs of each of the A/D converters 64 are provided to the input of a multiplexer 66. The multiplexer 66 which, in the present embodiment is preferably a time division multiplexer, receives the digital data signals from each of the A/D converters 64 and in a manner well known in the art transmits the received digital data signals to an appropriate serial input port 24 of the processor 12 in a predetermined time spaced order. It will be appreciated by those skilled in the art that the signal conditioners 62, A/D converters 64, and multiplexer 66 which are employed in connection with the presently preferred embodiment, are each of a type well known in the art and available from a variety of manufacturers. Complete details of the structure and operation of the signal conditioners 62, A/D converters 64, and multiplexer 66 are generally well known and need not be described in greater detail herein. Suffice it to say that the signal conditioners 62, A/D converters 64, and multiplexer 66 cooperate to take the raw analog output electrical signals from the sensors 40 and convert the raw signals into a digital form suitable for processing by the processor 12. It will be appreciated that the functions of the signal conditioners 62, A/D converters 64, and multiplexer 66 may be combined into a single sub-assembly or may be performed in any of several different manners. Moreover, the arrangement of the component parts may vary from what is shown in FIG. 1, for instance, the analog signals detected by the sensors 40 could be multiplexed prior to being converted to digital signals by the A/D converters 64. Thus, while the preferred embodiment employs such components, the particular components are not intended to be a limitation on the present invention.

The processor 12 receives and analyzes the digital signals from the A/D converters 64 and stores the digital data signals in the RAM 16. In the presently preferred embodiment, each of the conditioned and digitized signals from each of the three current probes 42, 44, 46, and from the three voltage probes 48, 50, 52 are individually analyzed and processed by the processor 12. As will be appreciated, the processor 12 operates in accordance with the processor software, preferably stored in the ROM 14 or otherwise stored and accessible for execution by the processor 12. Alternatively, the present invention may be implemented using other means, such as hard-wired logic circuits (not shown) used in combination with or instead of the processor and software.

Figure 2:
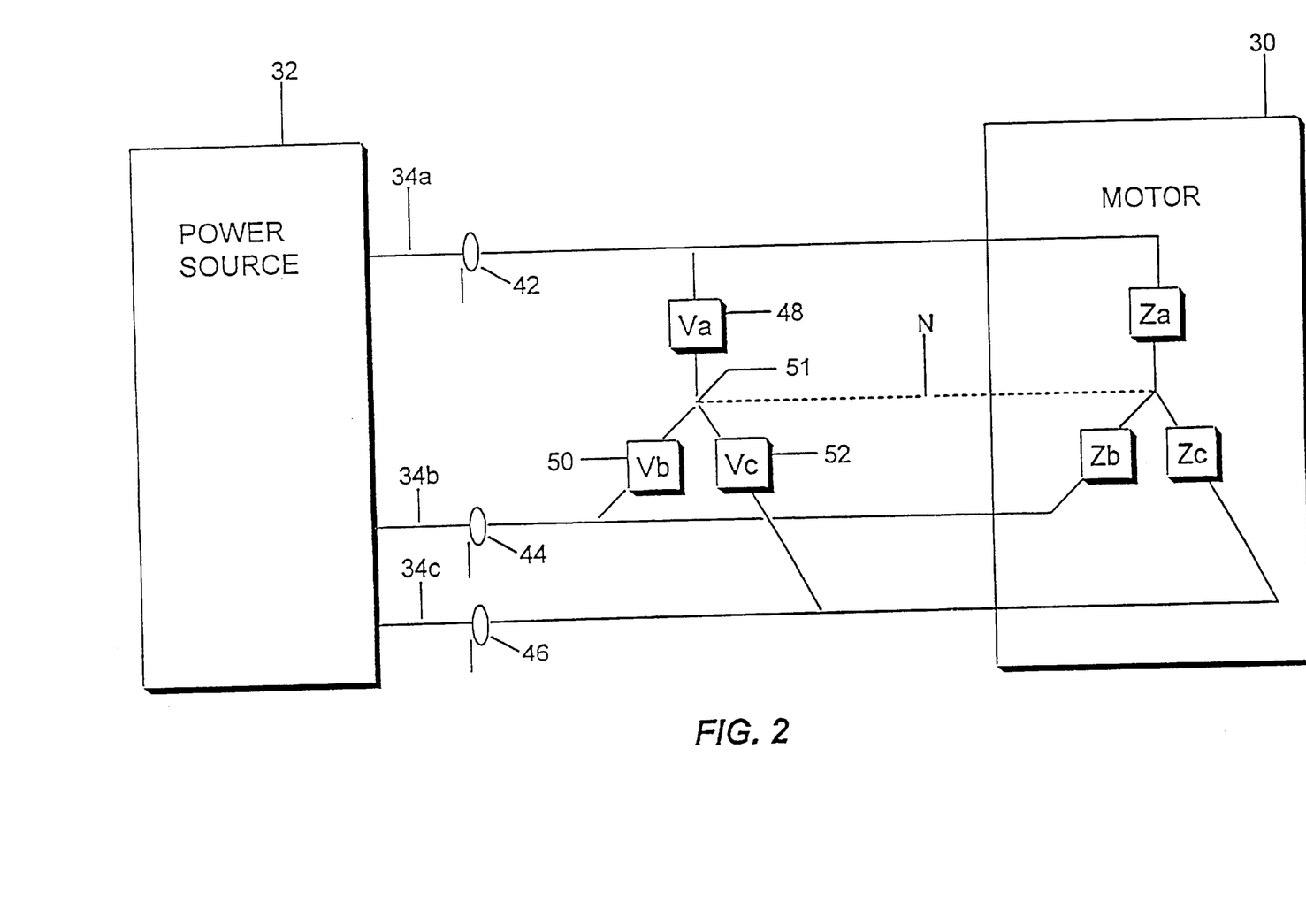
FIG. 2 is a more detailed functional schematic diagram of a portion of the system shown in FIG. 1.

FIG. 2 shows in greater detail the manner in which the electrical measurements are taken. In the illustrated embodiment, both the motor 30 and the voltage probes 48, 50, 52 are connected in a wye configuration, with an artificial neutral phase for measuring the phase-to-neutral voltage. One terminal of each of the voltage probes 48, 50, 52 is physically connected to each of the individual phase conductors 34a, 34b, 34c, respectively, with the other terminals of the voltage probes 48, 50, 52 being connected together at point 51 to form an artificial neutral. An optional neutral connection line (N) shown in phantom may be connected to the neutral of the motor circuit when the motor circuit is accessible.

The input wye circuit provides the capability to analyze both three and four wire wye motor configurations. When no external neutral (n) connection is made, the common "star point", indicated at 51, of the 3-wire wye circuit is driven to the algebraic mean of the three voltage inputs $V_a$, $V_b$, and $V_c$. That is, the star point 51 automatically assumes the "pseudo-neutral" potential (proper neutral for a balanced system). This allows the wye circuit to function as a "line-to-line to phase-to-neutral converter". The wye configuration has been found to work well, and is preferred, for 3-wire wye, 4-wire wye, and delta configured motors. In the delta and 3-wire wye configured cases, the neutral (N) is not connected. Although for delta and 3-wire wye configured motors measured with a wye apparatus the individual phase-to-neutral values are artificial, the individual current and line-to-line voltage measurements are accurate, as are the total real, reactive, and apparent powers, and total power factor, and all measurements based on these measurements. In the case of a motor configured as a 4-wire wye, if the neutral (N) is connected as shown in FIG. 2, all measurements are accurate, including phase-to-neutral measurements. It should be understood that while the voltage probes 48, 50, 52 illustrated in the present embodiment are preferably connected in a wye configuration, other connections, such as a delta type connection may be used.

Figure 3:
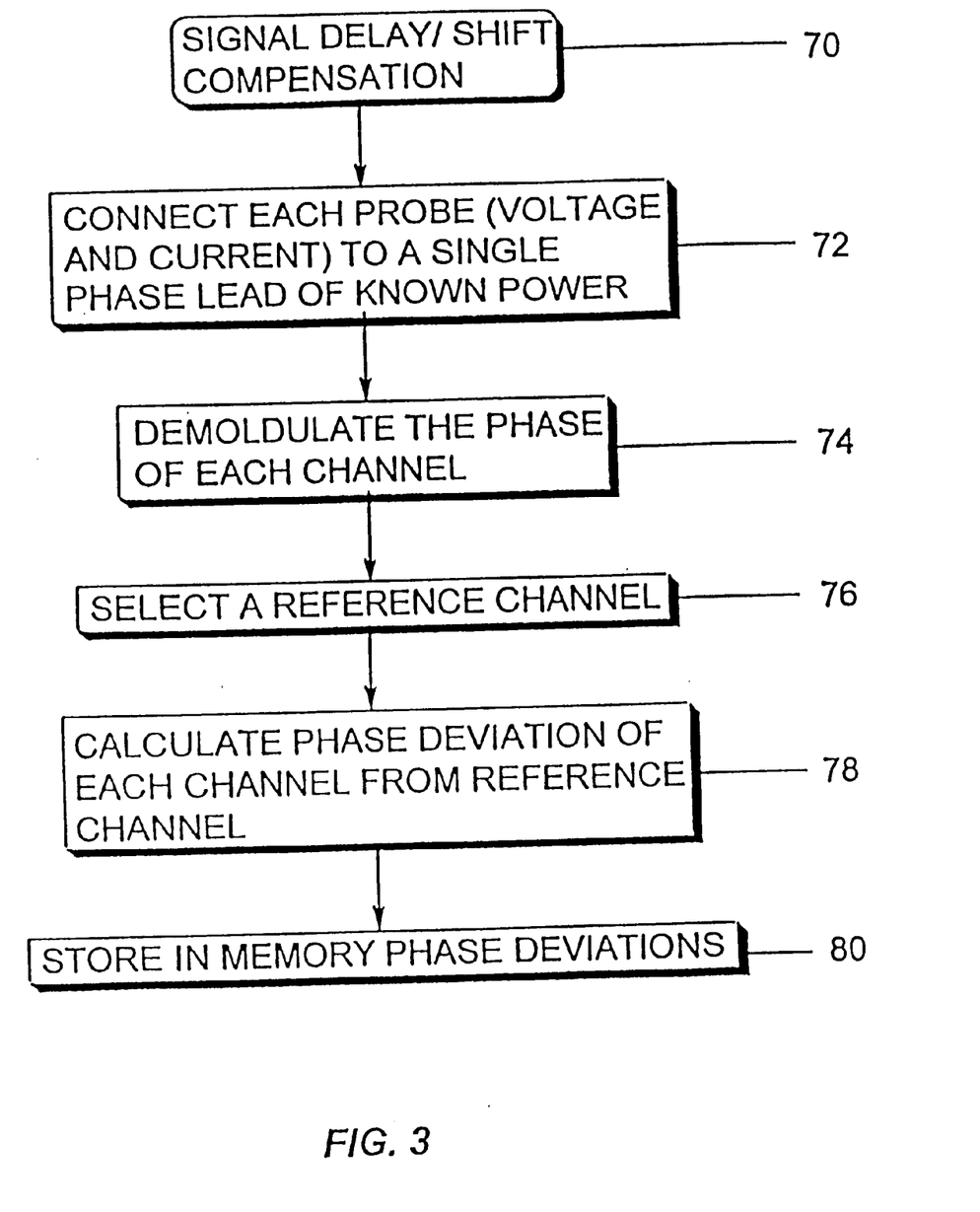
FIG. 3 is a flow diagram of a preferred method of calibrating the sensors in accordance with the system of FIG. 1.
Figure 4:
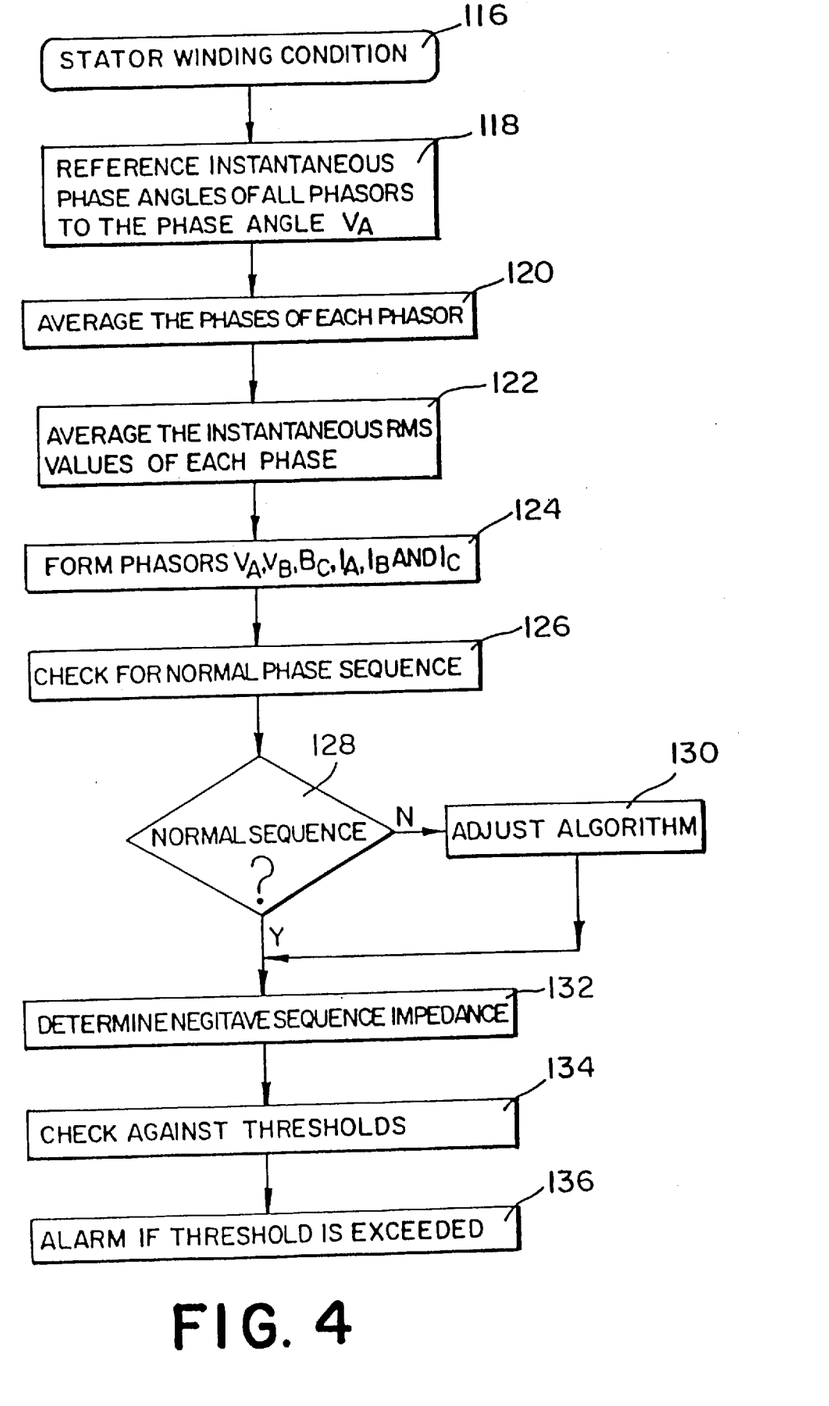
FIG. 4 is a flow diagram of a preferred method of determining stator winding condition in accordance with the system of FIG. 1.

FIGS. 3 and 4 are general flow diagrams of methods of the present invention, which methods are readily implemented in software which may be executed by the processor 12 or which may be executed on a computer, such as a personal computer, to which the data collected by the sensors 40 and stored in the system memory has been transferred. In the presently preferred embodiment, the processor based system 10 collects and stores the data collected by the sensors 40. The collected and stored data is then down loaded to a computer loaded with software implementing the data analysis methods of the present invention for providing analysis of the operation of the polyphase motor 30. The computer manipulates the sampled digital data received from the electrical sensors 40 in a manner hereinafter described and generates highly accurate outputs in the form of discrete data or plots of data versus time (traces) corresponding to particular electrical and mechanical parameters from which specific problems and faults can be identified. In addition, the present invention automatically detects such faults and indicates them to the user in high-level text messages, such as "stator winding fault". Only the particular identified problem(s) need then be repaired, thereby saving the cost of a complete motor system overhaul. Although the steps in the flow diagrams are shown as being executed sequentially, it will be understood by those of ordinary skill in the art that at least some and possibly many of the steps may be implemented in parallel and are not necessarily dependent upon the prior step shown in the flow diagram being executed first. Accordingly, the present invention is not meant to be limited to performing each of the steps shown in the exact sequence shown.

As previously discussed, the sensors 40 and related hardware (signal conditioners 62 and A/D converters 64) often introduce phase shifts or time delays between the data signals of each of the individual phase conductors 34a, 34b, 34c. In the present invention, the phase relationship between each of the conductors or supply lines 34a, 34b, 34c is important, and thus the present invention compensates for such phase shifts introduced into the digital data signals without the use of any added hardware, such as a phase meter.

Referring now to FIG. 3, the manner in which such phase shifts or time delays introduced into the digital data signals is compensated for is shown beginning at block 70, by calibrating the probes 42–52 and the associated signal conditioners 62 and determining a phase deviation for each of the digital data signals associated with each of the phase conductors 34a, 34b, 34c. Compensation for system errors is important because it is desirable to measure current and voltage phases very accurately in order to accurately determine voltage phasors for the polyphase motor 30. First, at step 72, the three current probes 42, 44, 46 and the three voltage probes 48, 50, 52 are placed on a single-phase lead (i.e., one of 34a, 34b or 34c) of known power factor from which the actual phase difference between the voltage and current can be computed. The power factor of the selected phase lead is determined using a calibrating instrument to provide a single phase current which is either in phase with the voltage or at a known out-of-phase relationship to the voltage. Alternatively, the power factor of the selected phase lead may be determined using an arbitrary but stable circuit having voltage and current measured using the sensors 42–52, and having a power factor or power factor angle which may be verified using either a calibrated phase meter or power factor meter (not shown).

The phase of each data signal (from each probe or channel) is then demodulated by means of any standard demodulation technique at step 74 by the processor 12. The preferred demodulation technique is to calculate the Fast Fourier Transform (FFT) of the data signal, zero the DC component, folding frequency and negative frequencies, double the positive frequencies, and then perform an inverse FFT. The phase is the four quadrant arctangent (usually known as atan2) of the imaginary component divided by the real component. Then the phase is unwrapped (it is preferred not to use a modulo-2 pi phase representation). All of the FFTs (of the different probe signals) are taken over the same time interval. At step 76, one probe signal is selected as a reference and then at step 78, the reference signal value is subtracted from all of the other probe data signals. Finally, in step 80, the phase deviation for each of the probes is stored (a value of zero is stored for the probe selected as the reference) in memory, such as the RAM 16. As a result of this process, the reference signal is at zero degrees, and the other probe data signals are referred to in relation to the reference signal.

The signal conditioners 62 can be phase-calibrated with the sensors 40 or separately, as desired. That is, the phase shift produced solely by the signal conditioner 62 is measured and compensated by itself (separate from the associated sensor) or a single phase shift measurement and correction is made for the each sensor 42–52 and its associated signal conditioner 62 as a unit. Once the phase deviation associated with each sensor 42–52 is determined (with respect to the reference sensor), the phase is corrected in subsequent calculations by subtracting a phase offset (i.e., the phase deviation) from the measured value. In this manner, all of the sensors 42–52 are brought into phase alignment so that any phase differences subsequently measured can be attributed strictly to motor and source characteristics.

When sensors are employed in which the phase shift or sensitivity is a function of frequency or current amplitude, this effect is compensated for by either determining the functional relationship between the dependent and independent parameter (for example, effect of frequency, the independent parameter, on-phase shift, the dependent parameter) and adjusting the phase values in accordance with measured line frequency or by creating a table relating the correction to the independent parameter, and looking up the appropriate correction for each case of the independent parameter in the table (e.g., a look-up table stored in memory such as the RAM 16).

Referring now to FIG. 4, a flow diagram of a preferred method of determining stator winding condition in accordance with the present invention is shown, beginning at step 116. First, at steps 118 to 124, the normal phasors are calculated using the instantaneous phasors, which are obtained from an analytic signal representation of the voltage and current signals, from the current and voltage sensors 42–52. At step 118, the instantaneous phase angles of all phasors ($V_a$ $V_b$ $V_c$ $I_a$ $I_b$ $I_c$) are referenced to the phase angle of $V_a$. This is done by subtracting the instantaneous, unwrapped phase of $V_a$ from the likewise instantaneous, unwrapped phases of $V_b$ $V_c$ $I_a$ $I_b$, and $I_c$. $V_a$ then has a zero phase. The other phasors have non-zero but stable (essentially constant) phases.

At step 120, after each phase has been referenced to $V_a$ the phases of each phasor are averaged, in order to reduce noise and at step 122, the instantaneous RMS values of each phase are averaged. At step 124, using the average RMS and average phase angle values calculated in steps 118 to 122, phasors $V_a$ $V_b$ $V_c$ $I_a$ $I_b$ and $I_c$ are formed.

In accordance with step 126, the electrical power (if multi phase) is checked for proper sequence. For three phase power, for example, the Phase angles for A, B and C will be, respectively, 0°, 240°, and 120° (approximately). If the phases are actually 0°, 120°, and 240°, then it can be concluded that the phase is reversed (128) and the effective negative sequence reactance and resistance must be calculated with a slightly different algorithm (130).

In step 132, the negative sequence resistance and negative sequence reactance are calculated as follows for a normal phase sequence:

$$R_2 = \mathrm{Re}\left\{\frac{VAI'}{|IAI'|}\right\}$$

$$X_2 = \mathrm{Im}\left\{\frac{VAI'}{|IAI'|}\right\}$$

where the prime (') denotes the transposed conjugate, V and I are vectors containing the normal component (not sequence components) of voltage and current, respectively, and A is a matrix of coefficients, as follows:

$$V = [V_a\ V_b\ V_c]$$

$$I = [I_a\ I_b\ I_c]$$

$$A = \begin{pmatrix} 1 & a & a^2 \\ a^2 & 1 & a \\ a & a^2 & 1 \end{pmatrix}$$

and a=exp (j120°).
Expressing the above matrices in algebraic form:

$$R_2 = \mathrm{Re}\left\{\frac{\begin{array}{c}V_a I_a^* + aV_a I_b^* + a^2 V_a I_c^* + a^2 V_b I_a^* + V_b I_b^* + aV_b I_c^* + \\ aV_c I_a^* + a^2 V_c I_b^* + V_c I_c^*\end{array}}{\begin{array}{c}|I_a I_a^* + aI_a I_b^* + a^2 I_a I_c^* + a^2 I_b I_a^* + I_b I_b^* + aI_b I_c^* + \\ +aI_c I_a^* + a^2 I_c I_b^* + I_c I_c^*|\end{array}}\right\}$$

$$X_2 = \mathrm{Im}\left\{\frac{\begin{array}{c}V_a I_a^* + aV_a I_b^* + a^2 V_a I_c^* + a^2 V_b I_a^* + V_b I_b^* + aV_b I_c^* + \\ aV_c I_a^* + a^2 V_c I_b^* + V_c I_c^*\end{array}}{\begin{array}{c}|I_a I_a^* + aI_a I_b^* + a^2 I_a I_c^* + a^2 I_b I_a^* + I_b I_b^* + aI_b I_c^* + \\ +aI_c I_a^* + a^2 I_c I_b^* + I_c I_c^*|\end{array}}\right\}$$

The asterisk (*) indicates complex conjugation.

The above formula is valid for motors running in the normal ABC sequence. If the motor is running in the reverse sequence, the calculation is made by exchanging the values of $V_b$ and $V_c$ and of $I_b$ and $I_c$. It is recognized that alternative methods of directly calculating the negative sequence components from the measured voltages and currents can be performed. In the above process, the normal electrical phasors are averaged before the calculation of the negative sequence resistance and reactance. Alternatively, the calculation of the negative sequence resistance and reactance $R_2$ and $X_2$ can be completed first on an instantaneous basis, then averaged.

The above-described method of directly calculating the effective negative sequence resistance and reactance from the measured voltages and currents is more accurate for resolution-limited and function-limited systems (such as frequently encountered with DSP boards) because it avoids two steps involving transcendental functions that occur in the prior art. One of these functions, the "atan2" is not available on some systems and its approximation introduces errors in the final result. It is best to avoid use of the atan2 function. In some cases the error may be enough to confuse an acceptable from an unacceptable change in the negative sequence resistance and reactance components. The two steps that are saved are, first, the conversion from rectangular (real and imaginary) to polar (phasor or vector) in the process of calculating the negative sequence current and voltage, and second, the conversion back to rectangular (after vectoral division) to obtain the final negative sequence resistance and reactance values. In contrast, the present invention, after initial conversion, maintains the coordinates in rectangular form and even the final division is by a scalar.

The effective $X_2$ and $R_2$ numbers so obtained are used to monitor the condition of the motor stator. Any significant change in these numbers indicates a degradation in the stator windings. The baseline condition is established by calculating the mean and standard deviation for each number ($X_2$ and $R_2$) independently. Although other measures of central tendency (instead of the mean) and data dispersion (instead of the standard deviation) may be used, the mean and standard deviation are preferred because of the many favorable statistical properties provided and because of their universal acceptance. The mean and standard deviation are established by a learning process in which they are both calculated for various load ranges of the motor over a period of time. Ideally at least 30 (preferably 100) observations, sequential over time and lasting over days, should be made at each load before the calculation of the mean and standard deviation are terminated and considered final. Unless the motor is subjected to new environmental conditions (such as being moved from one location to another, or is located outside and the season changes), the mean and standard deviation parameters (individually for effective $X_2$ and $R_2$ for each load category) should remain the same and should not be changed. (If the environmental conditions are significantly changed, a new mean and standard deviation should be calculated).

Two thresholds are established for detecting motor degradation. For detecting slow degradation in motor windings, the threshold is set at ±2 standard deviations away from the mean. This is used in the following manner. If there is a sustained exceedance of the data beyond ±2 standard deviations from the mean, this indicates a degradation trend. By sustained exceedance it is meant, for example, that four out of the most recent six observations have a value beyond the ±2 standard deviations. The exact number of standard deviations is not important, as long as it is between 1.5 and 2.5 standard deviations. Likewise, the exact number of exceedances is not critical, as long as the majority of data points exceeds the threshold for a sustained period of time. The key factor is that it be statistically extremely unlikely that the exceedances occur by chance alone for a sustained period of time. If the conditions are met, then it is concluded that the system is slowly degrading.

The other threshold is established for detection of rapid degradation of motor windings. In this case it is not necessary to check that the exceedance is sustained for a period of time. Because the degradation is rapid, it will be characterized by very great exceedances in a small period of time. Hence we are looking for one (or two consecutive) exceedance(s) which is greater than ±4 standard deviations from the mean. The exact number of standard deviations is not important. What is important is that we look for one or two observations which are extremely unlikely based on chance alone.

Note that both methods of detecting degradation (slow and fast) look for extremely unlikely events. The difference is that in the slow case, each observation by itself is only slightly unlikely, and it is only when the threshold crossing is sustained that it becomes extremely unlikely. On the other hand, in the case of rapid degradation, an individual exceedance is highly unlikely in and of itself.

At step 134, the calculated negative sequence resistance and reactance expand against slow- and fast-degradation thresholds, which have been developed in reference to baseline normal situations for the motor 30, and optionally also referenced to a specific load category.

At step 136, if either of the thresholds identified in steps 134 is exceeded, a stator fault condition is indicated and an alarm is activated.

From the foregoing description, it can be seen that the present invention comprises an improved method and apparatus for on-line analysis of the winding condition of polyphase electrical motors. It will be appreciated by those skilled in the art that changes could be made to the embodiment described above without departing from the broad inventive concept thereof. It is understood, therefore, that this invention is not limited to the particular embodiment disclosed, but it is intended to cover modifications within the spirit and scope of the present invention as defined by the appended claims.

What is claimed is:

1. A method of evaluating stator condition of a polyphase induction motor, the motor including a number of pole pairs, by using an electrical signature of the motor, comprising the steps of:
   (a) simultaneously sensing an instantaneous current signal supplied to the motor as a function of time for three electrical phases of the motor;
   (b) simultaneously sensing an instantaneous voltage supplied to the motor as a function of time for three electrical phases of the motor;
   (c) calculating an effective negative sequence reactance and resistance directly from the measured voltages and currents for each phase of the motor, without performing intermediate calculations of the negative sequence voltage or current;
   (d) comparing the effective negative sequence reactance ($X_2$) and the effective negative sequence resistance ($R_2$) to predetermined values whereby a predetermined difference between either $X_2$ and $R_2$ and the respective predetermined value is indicative of a stator winding fault.

2. The method of claim 1 wherein each predetermined value comprises a threshold designed to identify fast-degradation mechanisms based upon a large change in a fast period of time.

3. The method of claim 1 wherein each predetermined value comprises a threshold designed to identify slow-degradation mechanisms based upon a moderate change over a long period of time.

4. The method of claim 1 wherein the phase sequence of the motor is first examined to determine if the phase sequence is normal or reversed, and if reversed, exchanging phase B and C components, for both voltage and current prior to calculating the effective negative sequence reactance and resistance, in order to normalize the data.

5. The method of claim 1 wherein the predetermined valve are determined for each load category so that data is compared only for comparable loads.

* * * * *